(12) United States Patent
Chen et al.

(10) Patent No.: US 9,653,393 B2
(45) Date of Patent: May 16, 2017

(54) METHOD AND LAYOUT OF AN INTEGRATED CIRCUIT

(71) Applicant: Taiwan Semiconductor Manufacturing Company, Ltd., Hsin-Chu (TW)

(72) Inventors: Wei-Yu Chen, Hsin-Chu (TW); Li-Chun Tien, Tainan (TW); Hui-Zhong Zhuang, Kaohsiung (TW); Ting-Wei Chiang, New Taipei (TW); Hsiang-Jen Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 291 days.

(21) Appl. No.: 14/104,730

(22) Filed: Dec. 12, 2013

(65) Prior Publication Data

US 2015/0171005 A1     Jun. 18, 2015

(51) Int. Cl.
| | |
|---|---|
| *H01L 21/00* | (2006.01) |
| *H01L 23/522* | (2006.01) |
| *G06F 17/50* | (2006.01) |
| *H01L 23/528* | (2006.01) |
| *H01L 27/02* | (2006.01) |
| *H01L 27/118* | (2006.01) |

(52) U.S. Cl.
CPC ...... *H01L 23/5226* (2013.01); *G06F 17/5077* (2013.01); *H01L 23/528* (2013.01); *H01L 27/0207* (2013.01); *H01L 27/11807* (2013.01); *H01L 2924/0002* (2013.01)

(58) Field of Classification Search
CPC   H01L 23/5226; H01L 23/528; H01L 27/0207
See application file for complete search history.

(56) References Cited

U.S. PATENT DOCUMENTS

| | | | |
|---|---|---|---|
| 6,876,565 B2 * | 4/2005 | Meguro | H01L 27/105 257/E21.689 |
| 7,102,905 B2 | 9/2006 | Funaba et al. | |
| 2002/0074660 A1 * | 6/2002 | Fukasawa | H01L 21/76838 257/758 |

FOREIGN PATENT DOCUMENTS

| | | |
|---|---|---|
| JP | 2005223227 A | 8/2005 |
| KR | 20020046899 A | 6/2002 |

* cited by examiner

*Primary Examiner* — Laura Menz
(74) *Attorney, Agent, or Firm* — Slater Matsil, LLP

(57) ABSTRACT

An integrated circuit layout includes a first metal line, a second metal line, at least one first conductive via and a first conductive segment. The first metal line is formed along a first direction. The at least one first conductive via is disposed over the first metal line. The second metal line is disposed over at least one first conductive via and is in parallel with the first metal line. The first conductive segment is formed on one end of the second metal line.

20 Claims, 6 Drawing Sheets

METHOD AND LAYOUT OF AN INTEGRATED CIRCUIT

FIELD OF DISCLOSURE

The present disclosure is related to integrated circuits and, more particularly, to layout of an integrated circuits.

BACKGROUND

The trend in very-large-scale integration (VLSI) technology has resulted in narrower interconnection lines and smaller contacts. Furthermore, integrated circuit designs are becoming more complex and denser. More devices are compressed in integrated circuits to improve performance.

In the design of an integrated circuit, standard cells having predetermined functions are used. Layouts of standard cells are stored in cell libraries. When designing an integrated circuit, the respective layouts of the standard cells are retrieved from the cell libraries and placed into one or more desired locations on an integrated circuit layout. Routing is then performed to connect the standard cells with each other using interconnection tracks.

DETAILED DESCRIPTION

Figure 1:
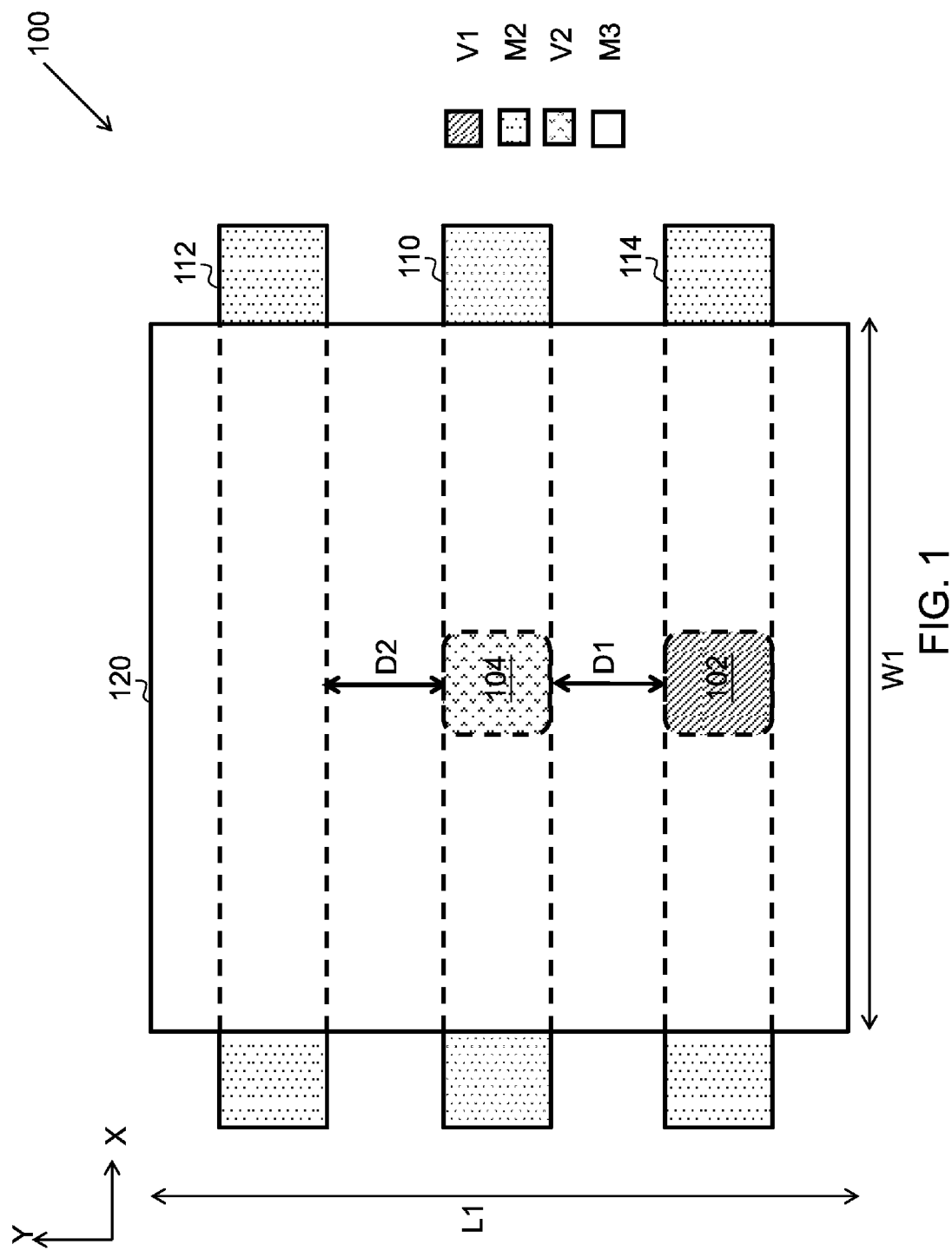
FIG. 1 is a top view of a layout 100 in accordance with some embodiments.

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Some embodiments have one or a combination of the following features and/or advantages. An integrated circuit layout includes a first metal line, a second metal line, at least one first conductive via, a first conductive segment and a second conductive segment. The first metal line is formed along a first direction. The at least one first conductive via is disposed over the first metal line. The second metal line is disposed over at least one first conductive via and is in parallel with the first metal line. The first conductive segment and the second conductive segment are formed on respective end of the second metal line.

FIG. 1 is a top view of a layout 100 illustrating potential problems of minimum spacing rules in specific layouts. For simplicity, the layout 100 only includes necessary components for illustration purpose. The layout 100 represents a layout structure to illustrate relationships between metallic layers, via layers and a set of predetermined design rules. In FIG. 1, various metallic layers and via layers are overlapped. The layout 100 includes conductive via one 102, conductive via two 104, metal two lines 110-114 and metal three line 120. In some embodiments, a layer of conductive via one is also referred to herein as V1. In some embodiments, a layer of conductive via two is also referred to herein as V2. In some embodiments, a layer of metal two line is also referred to herein as M2. In some embodiments, a layer of metal three line is also referred to herein as M3. In a top-down sequence, metal three line is connected through conductive via two and metal two line to corresponding conductive via one. The metallic layers and via layers used in this disclosure are for illustration purpose and any other metallic layers and via layers are within the scope of various embodiments.

In some embodiments, the metal three line 120 is arranged along Y direction. The conductive via one 102 and the conductive via two 104 are aligned along Y direction. A portion of the conductive via one 102 and the conductive via two 104 are overlapped relative X axis. In layout 100, length L1 is larger than a predetermined value R1 and is in parallel with Y direction that the conductive via one 102 and the conductive via two 104 are aligned along. In some embodiments, the predetermined value R1 is equal to or smaller than 32 nm. In some embodiments, a distance D1, between the conductive via one 102 and the conductive via two 104, is governed by the set of predetermined design rules associated with a predetermined manufacturing process that is used to manufacture the layout. As a result, the distance D1 needs to be controlled to avoid of design rule violations and possible process defects. In some embodiments, the distance D1 is equal to or larger than 32 nm. In such a situation, an area penalty of the layout 100 is suffered in order to meet the set of predetermined design rules.

In some embodiments, in layout 100, length L1 of the metal three line 120 is larger than width W1 of the metal three line 120, and width W1 is larger than a predetermined value R2. In some embodiments, the predetermined value R2 is equal to or less than 37 nm. A metal two line 112 is arranged to form and is in parallel with the metal two line 110 containing at least one conductive via two 104. In some embodiments, a distance D2, between the conductive via two 104 and the metal two line 112, is governed by a set of predetermined design rules associated with a predetermined manufacturing process that is used to manufacture the layout. As a result, the distance D2 needs to be controlled to avoid of design rule violations and possible process defects. In some embodiments, the distance D2 is equal to or less than 32 nm. In such a situation, an area penalty of the layout 100 is suffered in order to meet the set of predetermined design rules.

Figure 2:
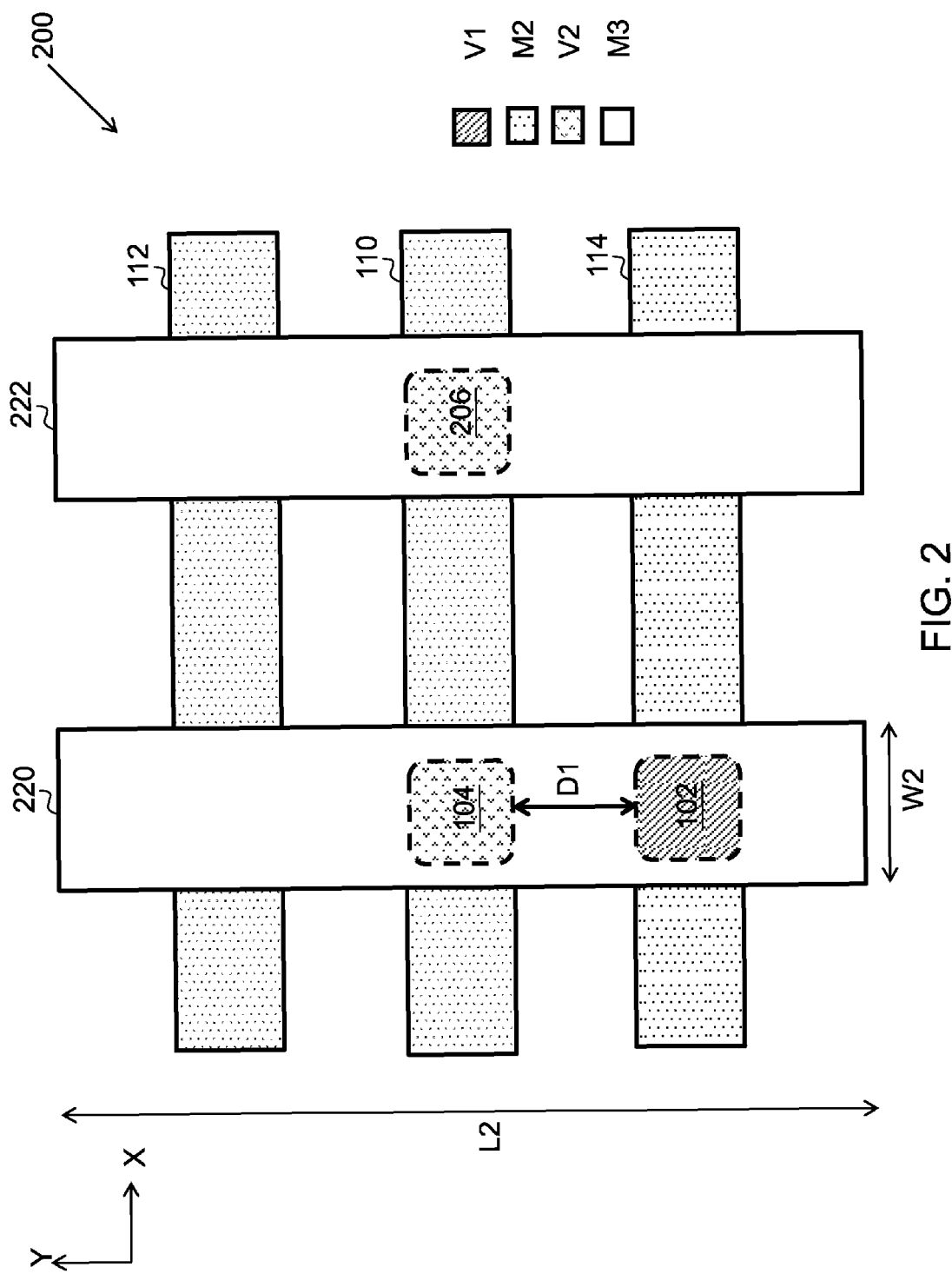
FIG. 2 is a top view of a layout 200 in accordance with some embodiments.

FIG. 2 is a top view of a layout 200 illustrating potential problems of minimum spacing rules in specific layouts. For simplicity, the layout 200 only includes necessary components for illustration purpose. The layout 200 represents a layout structure to illustrate relationships between metallic layers, via layers and the set of predetermined design rules. The layout 200 includes similar elements except for conductive via two 206 and metal three line 220-222 that are different from corresponding elements in FIG. 1. The metallic layers and via layers used in this disclosure are for illustration purpose and any other metallic layers and via layers are within the scope of various embodiments.

In some embodiments, the metal three lines 220-222 are arranged along Y direction and are in parallel with each other. The conductive via one 102 and the conductive via two 104 are aligned along Y direction. A portion of the conductive via one 102 and the conductive via two 104 are overlapped relative X axis. In layout 200, length L2 is larger than the predetermined value R1 and is in parallel with Y direction that the conductive via one 102 and the conductive via two 104 are aligned along. In such a situation, a distance D1, between the conductive via one 102 and the conductive via two 104, is still governed by the set of predetermined design rules. As a result, the distance D1 needs to be controlled to avoid of design rule violations.

In some embodiments, in layout 200, length L2 of the metal three line 220 is larger than width W2 of the metal three line 220, and width W2 is equal to or smaller than the predetermined value R2. With the layout structure of the layout 200, the metal two line 112 can be formed above and be adjacent to the conductive via two 104 without satisfying the distance D2 governed by the set of predetermined design rules.

Figure 3:
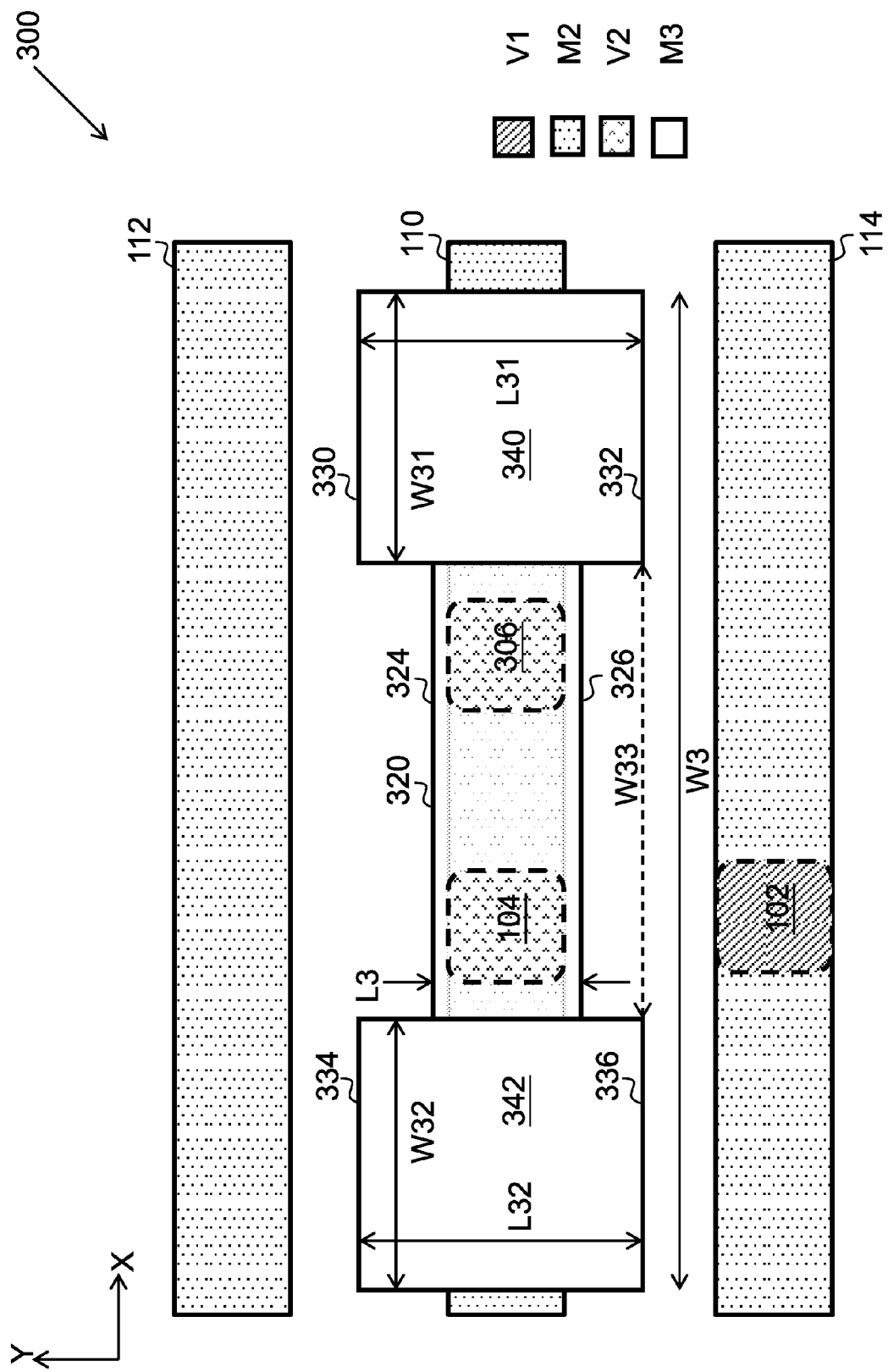
FIG. 3 is a top view of a layout 300 in accordance with some embodiments.

FIG. 3 is a top view of a layout 300 according to some embodiments. For simplicity, the layout 300 only includes necessary components for illustration purpose. The layout 300 represents a layout structure to illustrate relationships between metallic layers, via layers and the set of predetermined design rules. The layout 300 includes similar elements except for conductive via two 306, metal three line 320 and conductive segments 340-342 that are different from corresponding elements in FIG. 1. The metal three line 320 is formed horizontally and is disposed over the conductive via two 104 and 306. Furthermore, the metal three line 320 includes a top boundary 324 and a bottom boundary 326. The conductive segments 340-342 are formed on respective end of the metal three line 320. In some embodiments, only one of the conductive segments 340 and 342 is formed on one end of the metal three line 320. The conductive segment 340 includes a top boundary 330 and a bottom boundary 332. The conductive segment 342 includes a top boundary 334 and a bottom boundary 336. In some embodiments, the metal three line 320 together with the conductive segments 340-342 forms a H-like shape metal three line. The metallic layers and via layers used in this disclosure are for illustration purpose and any other metallic layers and via layers are within the scope of various embodiments.

The metal three lines 320 and the conductive segments 340-342 are arranged to form a H-like shape along X direction. Length L31 and L32 of the corresponding conductive segments 340 and 342 are arranged to be larger than length L3 of the metal three line 320. The conductive via one 102 and the conductive via two 104 are formed and extended along Y direction. A portion of the conductive via one 102 and the conductive via two 104 are overlapped on X axis.

In some embodiments, in layout 300, length L3 of the metal three line 320 is arranged to be smaller than the predetermined value R1 and is in parallel with Y direction that the conductive via one 102 and the conductive via two 104 are extended along. With the layout structure of the layout 300, conductive via one 102 can be formed below and be closer to the conductive via two 104 without satisfying the distance D1 governed by the set of predetermined design rules as discussed above in FIG. 1.

In some embodiments, in layout 300, width W3 represents a summation of width W33 of the metal three line 320, width W31 and W32 of the corresponding conductive segments 340 and 342. Length L3 of the metal three line 320 is smaller than width W3. With the layout structure of the layout 300, the metal two line 112 can be formed above and be adjacent to the conductive via two 104 without satisfying the distance D2 governed by the set of predetermined design rules as discussed above in FIG. 1.

In some embodiments, width W33 of the metal three line 320 can be larger than, smaller than or same size of width W31 of the conductive segment 340. In some embodiments, width W33 of the metal three line 320 can be larger than, smaller than or same size of width W32 of the conductive segment 342. In some embodiments, width W32 of the conductive segment 342 can be larger than, smaller than or same size of width W31 of the conductive segment 340. In some embodiments, length L32 of the conductive segment 342 can be larger than, smaller than or same size of length L31 of the conductive segment 340.

In some embodiments, width W33 of the metal three line 320 can be larger than, smaller than or same size of length L31 of the conductive segment 340. In some embodiments, width W33 of the metal three line 320 can be larger than, smaller than or same size of length L32 of the conductive segment 342. In some embodiments, width W32 of the conductive segment 342 can be larger than, smaller than or same size of length L31 of the conductive segment 340. In some embodiments, length L32 of the conductive segment 342 can be larger than, smaller than or same size of width W31 of the conductive segment 340.

In some embodiments, length L31 of the conductive segment 340 can be larger than, smaller than, or same size of width W31 of the conductive segment 340. In some embodiments, length L32 of the conductive segment 342 can be larger than, smaller than or same size of width W32 of the conductive segment 342.

In some embodiments, the top boundary 330 of the conductive segment 340 is aligned with the top boundary 324 of the metal three line 320 on Y axis. In such a situation, the metal three line 320 together with the conductive segments 340-342 form a h-like shape metal three line. Furthermore, the metal three line 320 together with the conductive segment 340 form a L-like shape metal three line. In some embodiments, the top boundary 334 of the conductive segment 342 is aligned with the top boundary 324 of the metal three line 320 on Y axis. In such a situation, the metal three line 320 together with the conductive segments 340-342 also form a h-like shape metal three line. Furthermore, the metal three line 320 together with the conductive segment 342 form a L-like shape metal three line. In some embodiments, the top boundary 330 of the conductive segment 340 and the top boundary 334 of the conductive segment 342 are simultaneously aligned with the top boundary 324 of the metal three line 320 on Y axis. In such a situation, the metal three line 320 together with the conductive segments 340-342 forms an U-like shape metal three line.

In some embodiments, the bottom boundary 332 of the conductive segment 340 is aligned with the bottom boundary 326 of the metal three line 320 on Y axis. In such a situation, the metal three line 320 together with the conductive segments 340-342 forms a h-like shape metal three line. In some embodiments, the bottom boundary 336 of the conductive segment 342 is aligned with the bottom boundary 326 of the metal three line 320 on Y axis. In such a situation, the metal three line 320 together with the conductive segments 340-342 also forms a h-like shape metal three line. In some embodiments, the bottom boundary 332 of the conductive segment 340 and the bottom boundary 336 of the conductive segment 342 are simultaneously aligned with the bottom boundary 326 of the metal three line 320 on Y axis. In such a situation, the metal three line 320 together with the conductive segments 340-342 forms an U-like shape metal three line.

In some embodiments, the top boundary 330 of the conductive segment 340 is aligned with the top boundary 324 of the metal three line 320, and the bottom boundary 336 of the conductive segment 342 is aligned with the bottom boundary 326 of the metal three line 320 on Y axis. In such a situation, the metal three line 320 together with the conductive segments 340-342 forms a Z-like shape metal three line. In some embodiments, the top boundary 334 of the conductive segment 342 is aligned with the top boundary 324 of the metal three line 320, and the bottom boundary 332 of the conductive segment 340 is aligned with the bottom boundary 326 of the metal three line 320 on Y axis. In such a situation, the metal three line 320 together with the conductive segments 340-342 forms a Z-like shape metal three line.

In some embodiments, conductive via three (not shown) are formed on respective area of the conductive segments 340 and 342. In some embodiments, size of one of the conductive via three (not shown) on respective conductive segments 340 and 342 can be equal to, larger than or smaller than size of one of the conductive via two 104 and 306.

Figure 4:
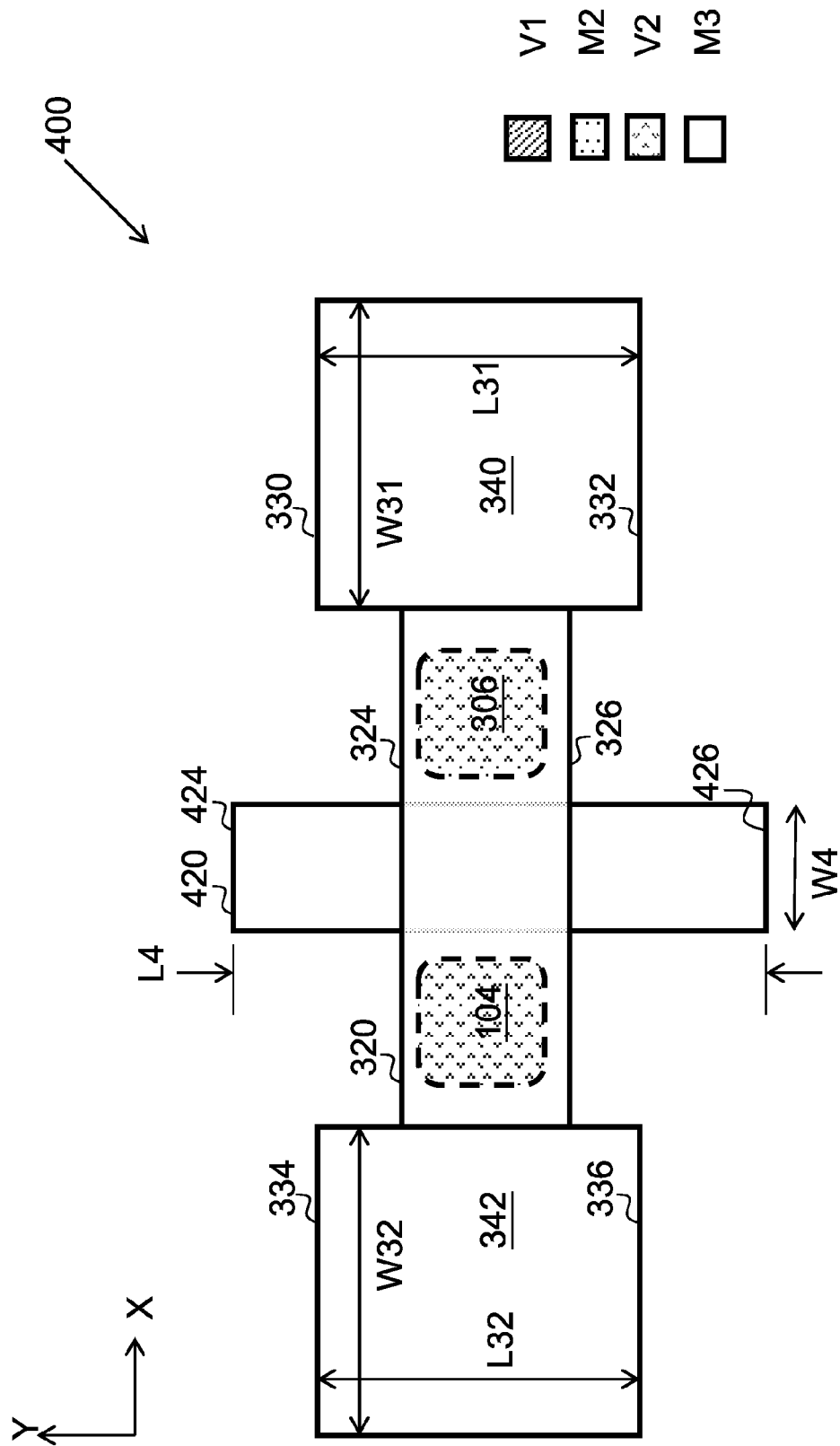
FIG. 4 is a top view of a layout 400 in accordance with some embodiments.

FIG. 4 is a top view of a layout 400 according to some embodiments. For simplicity, the layout 400 only includes elements in V2 and M3 layers for illustration purpose. The layout 300 includes similar elements in M3 layer except for metal three line 420 that are different from corresponding elements in M3 layer in FIG. 3. The metal three line 420 is formed vertically along Y direction and is in between the conductive via two 104 and 306. In some embodiments, the metal three line 420 is interposed between the conductive segments 340-342, and is perpendicular to the metal three line 320. Furthermore, the metal three line 420 includes a top boundary 424 and a bottom boundary 426. The metallic layers and via layers used in this disclosure are for illustration purpose and any other metallic layers and via layers are within the scope of various embodiments.

In some embodiments, the top boundary 424 of the metal three line 420 is aligned with the top boundary 324 of the metal three line 320. In some embodiments, the bottom boundary 426 of the metal three line 420 is aligned with the bottom boundary 326 of the metal three line 320.

In some embodiments, width W4 of the metal three line 420 can be smaller than, larger than or same size of width W31 of the conductive segment 340. In some embodiments, width W4 of the metal three line 420 can be smaller than, larger than or same size of width W32 of the conductive segment 342. In some embodiments, width W4 of the metal three line 420 can be smaller than, larger than or same size of both width W31 and W32 of respective conductive segments 340 and 342.

In some embodiments, length L4 of the metal three line 420 can be smaller than, larger than or same size of length L31 of the conductive segment 340. In some embodiments, length L4 of the metal three line 420 can be smaller than, larger than or same size of length L32 of the conductive segment 342. In some embodiments, length L4 of the metal three line 420 can be smaller than, larger than or same size of both length L31 and L32 of respective conductive segments 340 and 342.

In some embodiments, length L4 of the metal three line 420 is larger than length L3 of the metal three line 320.

Figure 5:
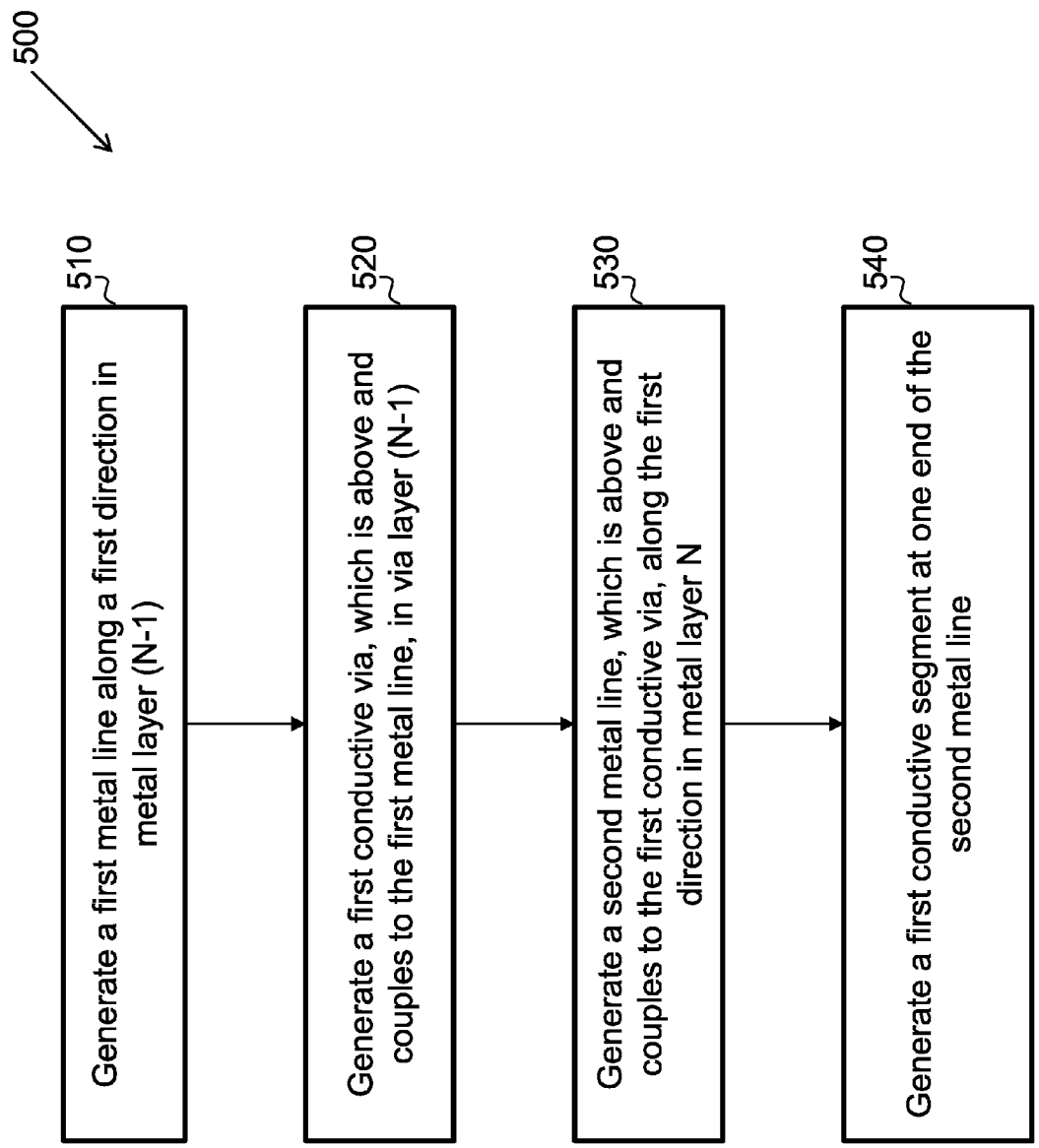
FIG. 5 is a flow chart 500 of a layout method in accordance with some embodiments.

FIG. 5 is a flow chart 500 of a layout method according to some example embodiments.

In operation 510, a first metal line is generated along a first direction in metal layer (N−1). For example, in FIG. 3, the metal two line 110 is generated along X direction in M2 layer.

In operation 520, a first conductive via is generated in via layer (N−1). The first conductive via is above and couples to the first metal line. For example, in FIG. 3, the conductive via two 104 in V2 layer is above and couples to the metal two line 110.

In operation 530, a second metal line is generated along the first direction in metal layer N. The second metal line is above and couples to the first conductive via. For example, in FIG. 3, the metal three line 320 is above and couples to the conductive via two 104 and is formed along X direction in M3 layer.

In operation 540, a first conductive segment is generated at one end of the second metal line. For example, in FIG. 3, the conductive segment 340 is generated at right end of the metal three line 320. For another example, the conductive segment 342 is generated at left end of the metal three line 320.

Figure 6:
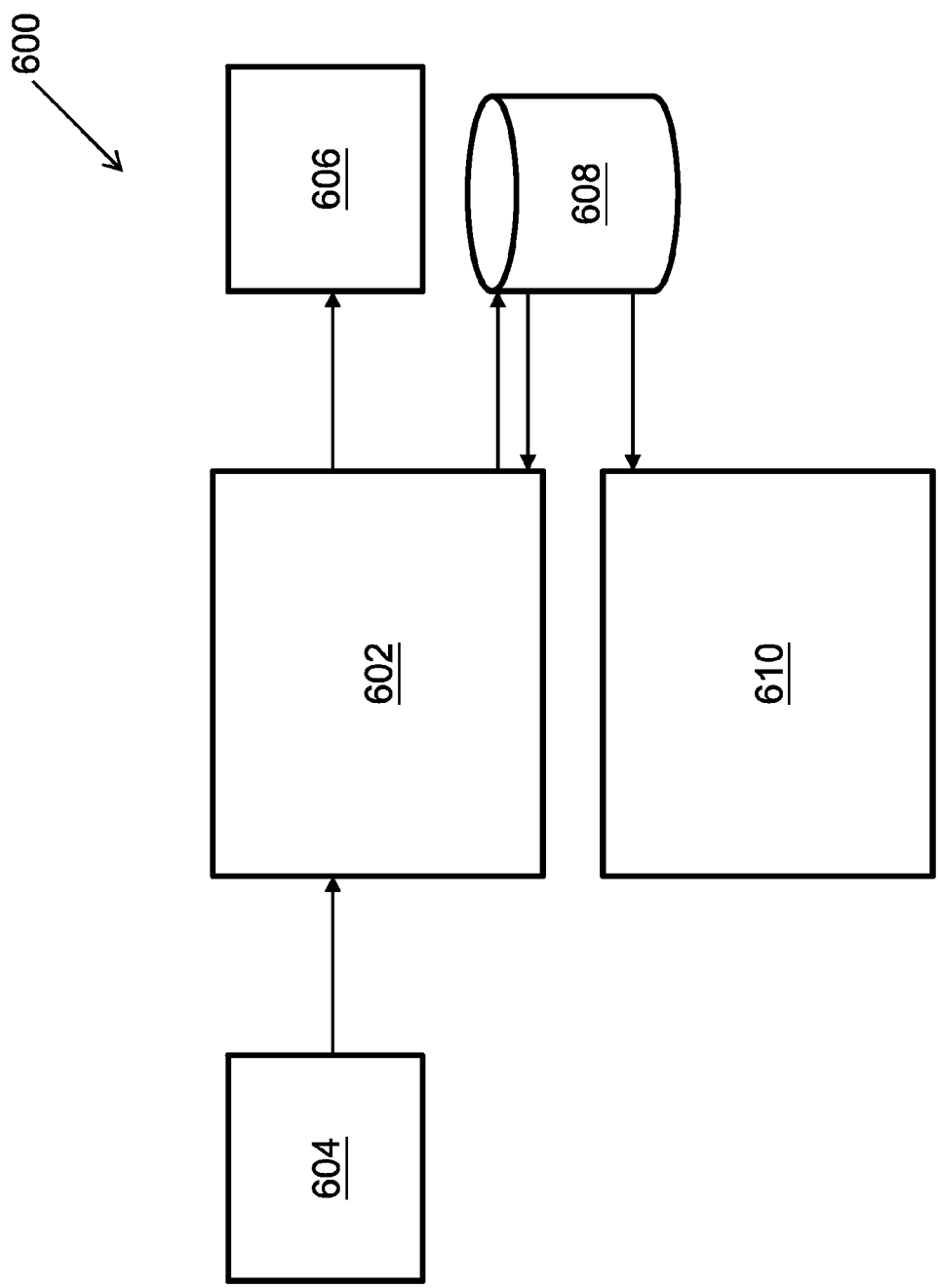
FIG. 6 illustrates a processing system 600 to implement the flow chart 500 in accordance with some embodiments.

FIG. 6 illustrates a processing system 600 wherein the above described method may be implemented in order to generate one or more of the above described layout embodiments. Processing system 600 includes a processor 602, which may include a central processing unit, input/output circuitry, signal processing circuitry, and volatile and/or non-volatile memory. Processor 602 receives input, such as user input, from input device 604. Input device may include one or more of a keyboard, a mouse, a tablet, a contact sensitive surface, a stylus, a microphone, and the like. Processor 602 may also receive input, such as standard cell layouts, cell libraries, models, and the like, from machine readable permanent storage medium 608. Machine readable permanent storage medium may be located locally to processor 602, or may be remote from processor 602, in which case communications between processor 602 and machine readable permanent storage medium occur over a network, such as a telephone network, the Internet, a local area network, wide area network, or the like. Machine readable permanent storage medium may include one or more of a hard disk, magnetic storage, optical storage, non-volatile memory storage, and the like. Included in machine readable permanent storage medium may be database software for organizing data and instructions stored on machine readable permanent storage medium 608. Processing system 600 may include output device 606, such as one or more of a display device, speaker, and the like for outputting information to a user. As described above, processor 602 generates a layout for an integrated circuit. The layout may be stored in machine readable permanent storage medium 608. One or more integrated circuit manufacturing machines, such as a photomask generator 610 may communicate with machine readable permanent storage medium 608, either locally or over a network, either directly or via an intermediate processor such as processor 602. In one embodiment, photomask generator generates one or more photomasks to be used in the manufacture of an integrated circuit, in conformance with a layout stored in machine readable permanent storage medium 608.

In some embodiments, an integrated circuit layout includes a first metal line, a second metal line, at least one first conductive via and a first conductive segment. The first metal line is formed along a first direction. In some embodiments, the first direction is a direction of X axis. In some embodiments, the first direction is a direction of Y axis. The at least one first conductive via is disposed over the first metal line. The second metal line is disposed over at least one first conductive via and is in parallel with the first metal line. The first conductive segment is formed on one end of the second metal line.

In some embodiments, an integrated circuit layout includes a first metal line, a first conductive via, a second metal line, a first conductive segment and a second conductive segment. The first metal line is formed in metal layer (N−1) along a first direction. In some embodiments, the first direction is a direction of X axis. In some embodiments, the first direction is a direction of Y axis. The first conductive via in via layer (N−1) is disposed over the first metal line. The second metal line is formed in metal layer (N) and is in parallel with the first metal line. Furthermore, the second metal line is disposed over the first conductive via. The first conductive segment and the second conductive segment are formed on respective end of the second metal line in metal layer (N).

In some embodiments, a method of configuring an integrated circuit layout using a processor includes generating a first metal line along a first direction in metal layer (N−1) using the processor. The method also includes generating a first conductive via, which is above and couples to the first metal line, in via layer (N−1) using the processor. The method further includes generating a second metal line, which is above and couples to the first conductive via, along the first direction in metal layer N using the processor. The method further includes generating a first conductive segment at one end of the second metal line. The method further includes generating a set of instructions for manufacturing an integrated circuit based upon the layout, and storing the set of instructions in a machine readable permanent storage medium.

The sequences of the operations in the flow chart 500 are used for illustration purpose. Moreover, the sequences of the operations in the flow chart 500 can be changed. Some operations in the flow chart 500 can be skipped, and/or other operations can be added without limiting the scope of claims appended herewith.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. An integrated circuit, comprising:
   a first metal line having a length and a width, the length of the first metal line formed along a first direction;
   at least one first conductive via disposed over the first metal line;
   a second metal line having a length and a width, the length of the second metal line formed along the first direction, the second metal line disposed over the at least one first conductive via and in parallel with the first metal line;
   a first conductive segment formed on a first end of the second metal line, a width of the first conductive segment greater than the width of the first metal line and the width of the second metal line; and
   a second conductive segment formed on a second, opposing end of the second metal line, a width of the second conductive segment greater than the width of the first metal line and the width of the second metal line.

2. The integrated circuit of claim 1, wherein a top boundary of the first conductive segment is aligned with a top boundary of the second metal line.

3. The integrated circuit of claim 1, wherein a bottom boundary of the first conductive segment is aligned with a bottom boundary of the second metal line.

4. The integrated circuit of claim 1, wherein the length of the second metal line is equal to or larger than a summation of a length of the first conductive segment and the second conductive segment.

5. The integrated circuit of claim 1, wherein a width of the first conductive segment is equal to or larger than a width of the second conductive segment.

6. The integrated circuit of claim 1, wherein a length of the first conductive segment is equal to or larger than a length of the second conductive segment.

7. An integrated circuit, comprising:
   a first metal line formed in a first metal layer, the first metal line having a length and a width, the length of the first metal line formed along a first direction;
   a conductive via disposed over the first metal line;
   a second metal line formed in a second metal layer over the conductive via, the second metal line having a length and a width, the length of the second metal line formed along the first direction;
   a first conductive segment extending from one end of the second metal line, the first conductive segment having a width greater than the width of the second metal line; and
   a second conductive segment extending from another end of the second metal line, the second conductive segment having a width greater than the width of the second metal line.

8. The integrated circuit of claim 7, wherein a top boundary of the first conductive segment is aligned with a top boundary of the second metal line.

9. The integrated circuit of claim 7 wherein the length of the second metal line is equal to or larger than a summation of a length of the first conductive segment and the second conductive segment.

10. The integrated circuit of claim 7, wherein the second metal line together with one of the first conductive segment and the second conductive segment form a H-like shape metal line in the second metal layer.

11. An integrated circuit comprising:
    a first metal line formed in a first metal layer, the first metal line having a length and a width, the length of the first metal line formed along a first direction;
    a conductive via above the first metal line;
    a second metal line formed in a second metal layer above the conductive via, the second metal line having a length and a width, the length of the second metal line formed along the first direction;

a first conductive segment extending from a first lateral extent of the second metal line, the first conductive segment having a width greater than the width of the second metal line; and a second conductive segment extending from a second lateral extent of the second metal line, the second conductive segment having a width greater than the width of the second metal line.

12. The integrated circuit of claim 11, wherein an upper extent of the first conductive segment is aligned with an upper extent of the second metal line.

13. The integrated circuit of claim 12, wherein a lower extent of the first conductive segment is aligned with a lower extent of the second metal line.

14. The integrated circuit of claim 13, wherein the length of the second metal line is greater than or equal to an aggregate length of the first conductive segment and the second conductive segment.

15. The integrated circuit of claim 14, wherein a width of the first conductive segment is greater than or equal to a width of the second conductive segment.

16. The integrated circuit of claim 15, wherein a length of the first conductive segment is greater than or equal to a length of the second conductive segment.

17. The integrated circuit of claim 16, wherein the second metal line and one of the first conductive segment or the second conductive segment form an orthogonal shape in the second metal layer.

18. The integrated circuit of claim 17, wherein the second metal line and the first conductive segment form a H-like shape metal line in the second metal layer.

19. The integrated circuit of claim 17, wherein the second metal line and the second conductive segment form a H-like shape metal line in the second metal layer.

20. The integrated circuit of claim 11, wherein the second lateral extent opposes the first lateral extent.

* * * * *